(12) United States Patent
Ha

(10) Patent No.: US 9,001,584 B2
(45) Date of Patent: Apr. 7, 2015

(54) SUB-BLOCK DECODING IN 3D MEMORY

(71) Applicant: Micron Technology, Inc., Boise, ID (US)

(72) Inventor: Chang Wan Ha, San Ramon, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/781,016

(22) Filed: Feb. 28, 2013

(65) Prior Publication Data

US 2014/0241060 A1    Aug. 28, 2014

(51) Int. Cl.
*G11C 16/04*    (2006.01)

(52) U.S. Cl.
CPC ...................... *G11C 16/04* (2013.01)

(58) Field of Classification Search
CPC ......... G11C 16/08; G11C 16/10; G11C 16/16
USPC ............................ 365/185.11, 185.18, 185.23
See application file for complete search history.

(56) References Cited

U.S. PATENT DOCUMENTS

| | | | | |
|---|---|---|---|---|
| 5,963,475 | A * | 10/1999 | Choi et al. | 365/185.11 |
| 7,633,829 | B2 | 12/2009 | Fasoli et al. | |
| 8,274,108 | B2 | 9/2012 | Katsumata et al. | |
| 2007/0070708 | A1 | 3/2007 | Ichige et al. | |
| 2007/0158736 | A1 | 7/2007 | Arai et al. | |
| 2009/0251962 | A1* | 10/2009 | Yun et al. | 365/185.02 |
| 2010/0072538 | A1 | 3/2010 | Kito et al. | |
| 2010/0090286 | A1 | 4/2010 | Lee et al. | |
| 2010/0322000 | A1 | 12/2010 | Shim et al. | |
| 2011/0085377 | A1 | 4/2011 | Mizukami et al. | |
| 2011/0216603 | A1* | 9/2011 | Han et al. | 365/185.23 |
| 2011/0286269 | A1* | 11/2011 | Pascucci et al. | 365/185.05 |
| 2011/0286283 | A1 | 11/2011 | Lung et al. | |
| 2011/0287597 | A1 | 11/2011 | Kito et al. | |
| 2012/0039130 | A1* | 2/2012 | Yoon et al. | 365/185.18 |
| 2012/0147644 | A1 | 6/2012 | Scheuerlein | |
| 2012/0201080 | A1* | 8/2012 | Kang et al. | 365/185.11 |
| 2013/0051161 | A1* | 2/2013 | Tanzawa | 365/189.09 |
| 2013/0258781 | A1* | 10/2013 | Goda et al. | 365/185.17 |

FOREIGN PATENT DOCUMENTS

WO    WO-2010047912 A1    4/2010

OTHER PUBLICATIONS

"International Application No. PCT/US2014/019065, International Search Report mailed Jun. 18, 2014", 3 pgs.
"International Application No. PCT/US2014/019065, Written Opinion mailed Jun. 18, 2014", 5 pgs.

* cited by examiner

*Primary Examiner* — Jason Lappas
(74) *Attorney, Agent, or Firm* — Schwegman Lundberg & Woessner, P.A.

(57) ABSTRACT

Some embodiments relate to apparatuses and methods associated with blocks of memory cells. The blocks of memory cells may include two or more sub-blocks of memory cells. Sub-blocks may comprise a vertical string of memory cells including a source select transistor and a drain select transistor. An apparatus may include two or more drain select lines, of which a first drain select line is coupled to a drain select transistor in a first sub-block of a first block and to a drain select transistor in a first sub-block of a second block. A second drain select line in the apparatus may be coupled to a drain select transistor in a second sub-block of the first block and to a drain select transistor in a second sub-block of the second block. Other apparatuses and methods are described.

25 Claims, 8 Drawing Sheets

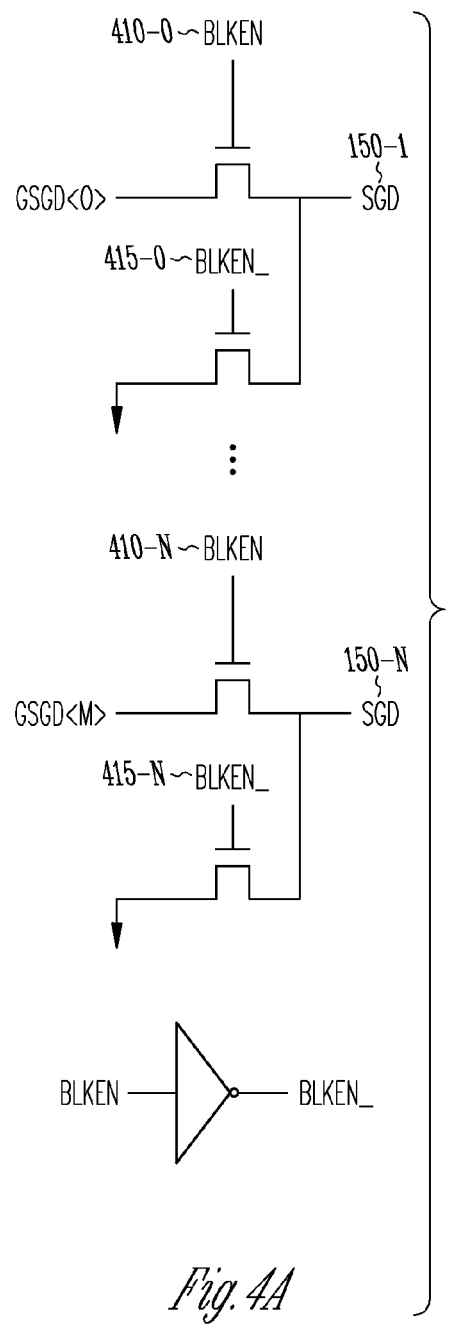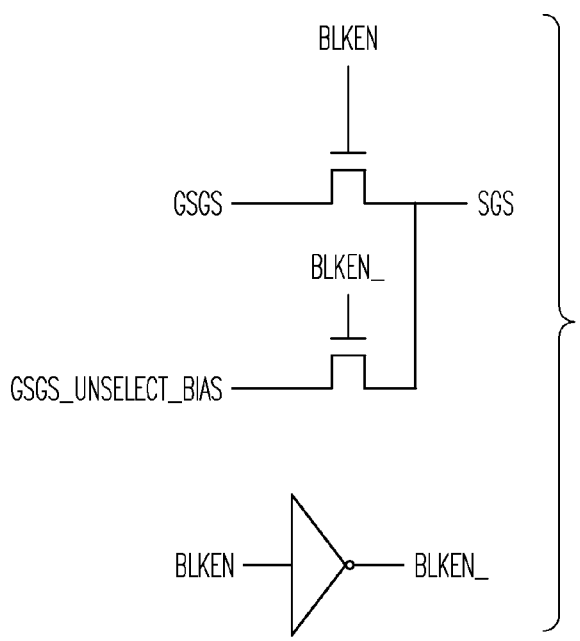
Fig. 4A
Fig. 4B

SUB-BLOCK DECODING IN 3D MEMORY

BACKGROUND

Memory devices, such as flash memory, are widely used in computers and many electronic items. Some memory devices may include memory cells stacked vertically to form three-dimensional (3D) blocks of memory components. As larger numbers of memory cells are vertically stacked, it may become increasingly difficult to couple (e.g., electrically connect) the stacks to two-dimensional devices. Block size may be made relatively large to allow more space for routing and improved connectivity. However, increasing block size may lead to increased memory erase time and increased memory fragmentation.

BRIEF DESCRIPTION OF THE DRAWINGS

Some embodiments are illustrated by way of example and not limitation in the figures of the accompanying drawings in which:

FIGS. 4A and 4B are schematic diagrams of implementations for sub-block and block select and deselect transistors in accordance with some embodiments;

DETAILED DESCRIPTION

A block of memory cells, such as those comprising charge storage devices, resistance variable devices, or other devices which can be programmed to store data and/or from which data can be read, according to various embodiments of the invention may function as a block of memory cells in a memory device such as a NOT AND (NAND) memory device. Memory cells may be arranged in a three-dimensional manner.

Figure 1:
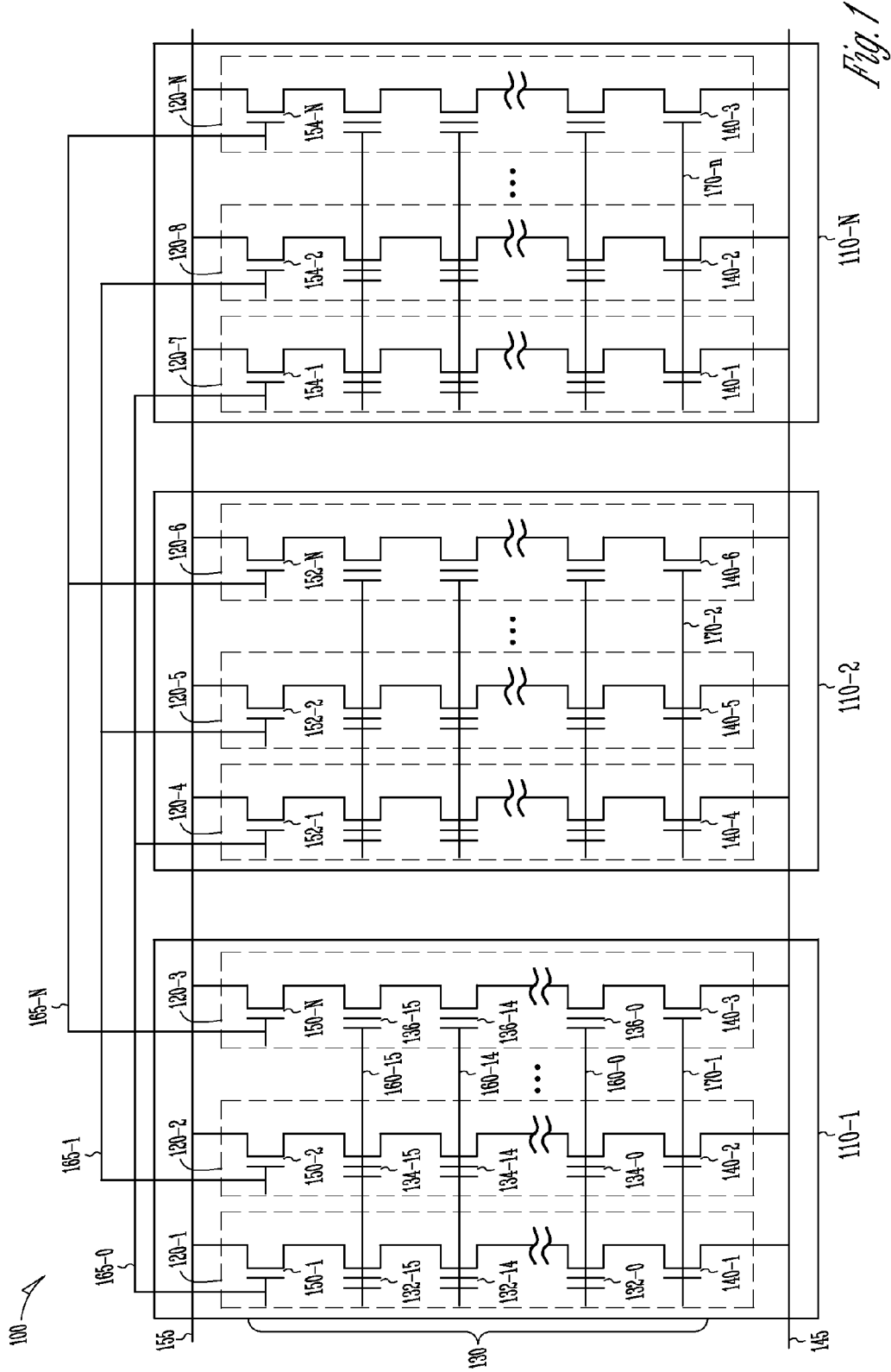
FIG. 1 is an electrical schematic diagram of an apparatus in the form of one or more blocks of vertical strings of memory cells in accordance with some embodiments.

FIG. 1 shows a block diagram of an apparatus in the form of a memory device 100. The memory device 100 may include two or more blocks 110-1 through 110-n. Each block 110-1 through 110-n may include two or more sub-blocks 120-1 through 120-n. The two or more sub-blocks 120-1 through 120-n may each comprise a vertical string 130. The vertical string 130 may include a number of memory cells 132-0 through 132-15. In the illustrative example, the vertical string 130 includes 16 memory cells. However, it will be understood that the vertical string 130 may include any number of memory cells. The memory cells 132-0 through 132-15 may be coupled in series.

The vertical string 130 may include a source select gate (SGS) transistor 140-1, which is sometimes also referred to herein as a "source select transistor". The SGS transistor 140-1 may be an n-channel transistor coupled between one of the memory cells 132-0 at one end of the vertical string 130 and a common source 145. The common source 145 may comprise, for example, a slot of commonly doped semiconductor material and/or other conductive material. At the other end of the vertical string 130, a drain select gate (SGD) transistor 150-1, which is sometimes also referred to herein as a "drain select transistor", may be an n-channel transistor coupled between one of the memory cells 132-15 and a data line (e.g., bit line) 155.

Lines 160-0 through 160-15 can form part of access lines (e.g., word lines) of the memory device 100. Word lines 160-0 through 160-15 may be shared across corresponding memory cells in corresponding sub-blocks of a block. For example, word line 160-15 may be shared by memory cells 132-15 of sub-block 120-1, 134-15 of sub-block 120-2, and 136-15 of sub-block 120-3. Similarly, word line 160-14 may be shared by memory cells 132-14 of sub-block 120-1, 134-14 of sub-blocks 120-2 and 136-14 of sub-block 120-3.

The common source 145 can be selectively coupled to a reference voltage Vss (e.g., ground voltage) or a voltage source (e.g., a charge pump circuit, not shown). Two elements are coupled directly when they are in direct electrical contact with each other, or indirectly when they are separated by one or more conductors, semiconductors or other elements that enable conduction of a current between the indirectly coupled elements. For example, two elements in direct electrical contact with each other might be in physical contact at a junction (e.g., a p-n junction) that enables a flow of electrons or holes across the junction, without intervening conductive elements.

Each memory cell 132-0 through 132-15 may comprise, for example, a floating gate transistor or a charge trap transistor and may be a single level memory cell or a multilevel memory cell. The memory cells 132-0 through 132-15, the SGS transistor 140-1, and the SGD transistor 150-1 are controlled by signals on their respective control gates.

The SGS transistor 140-1 receives a signal that controls the SGS transistor 140-1 to control conduction between the vertical string 130 and the common source 145. The SGD transistor 150-1 receives a signal that controls the SGD transistor 150-1, so that the SGD transistor 150-1 can be used to select or deselect the vertical string 100. The vertical string 100 can be one of multiple vertical strings of memory cells in a block 110-1 in a memory device 11, such as a NAND memory device.

Each block 110-1 through 110-n may include a source select line 170-1 through 170-n, respectively. A first source select line 170-1 may couple to the SGS transistor 140-1 in the first sub-block 120-1, to the SGS transistor 140-2 in the second sub-block 120-2, and to each other SGS transistor in the first block 110-1. Similarly, a second source select line 170-2 may couple to the SGS 140-4 transistor in the first sub-block 120-4, to the SGS transistor 140-5 in the second sub-block 120-5, and to each other SGS transistor in the second block 110-2.

Figure 2:
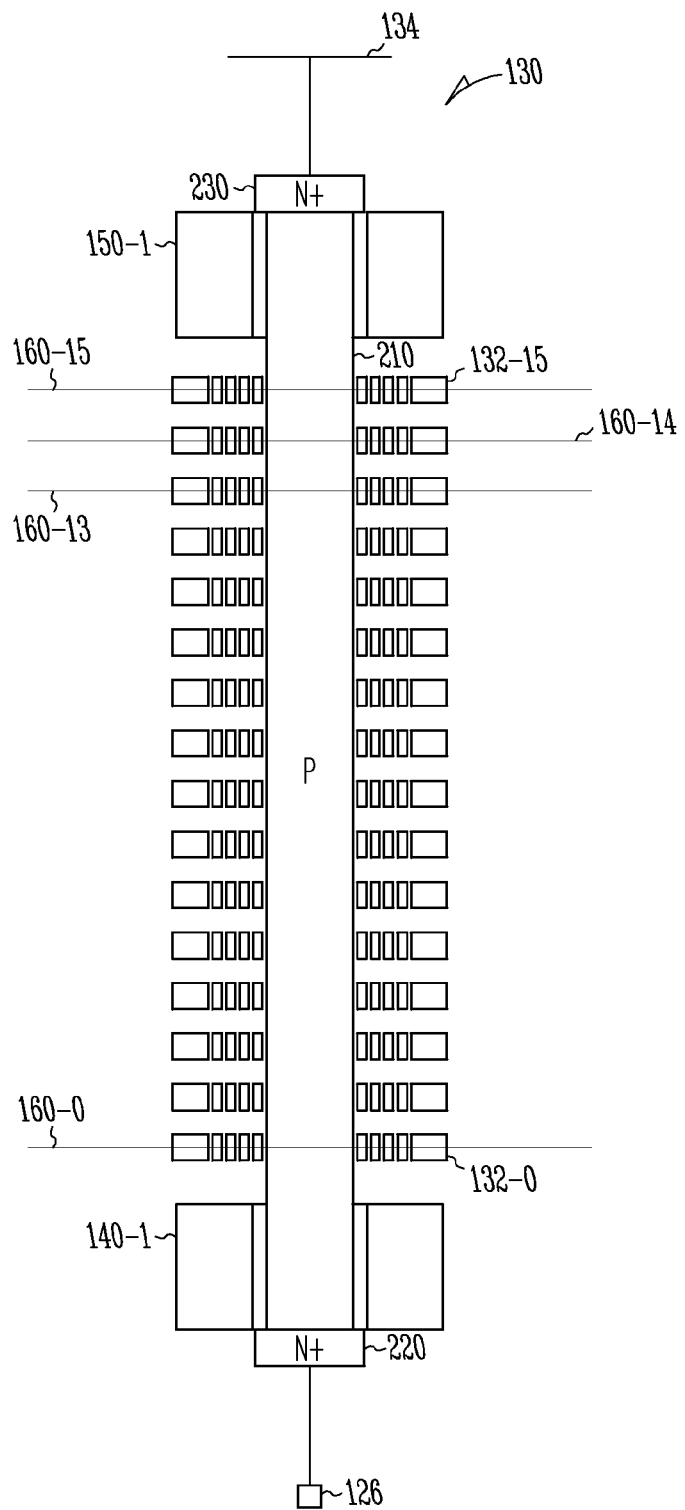
FIG. 2 is a cross-sectional view of a semiconductor construction of a vertical string in accordance with some embodiments.

FIG. 2 is a cross-sectional view of a semiconductor construction of a vertical string 130 of the two or more vertical strings 130 shown in FIG. 1 according to various embodiments. The memory cells 132-0 through 132-15, the SGS transistor 140-1 and the SGD transistor 150-1 at least partially surround (e.g., completely surround or partially surround) a pillar 210 of semiconductor material. The pillar 210 can comprise p type polysilicon and is a channel for the memory cells 132-0 through 132-15, the SGS transistor 140-1 and the SGD transistor 150-1. The memory cells 132-0 through 132-15, the SGS transistor 120 and the SGD transistor 150-1 are associated with the pillar 210. The pillar 210 extends between a source cap 220 comprising n+ type polysilicon and a drain cap 230 comprising n+ type polysilicon. The memory cells 132-0 through 132-15 of the vertical string 100 are located in different tiers of the semiconductor construction along a vertical extent of the pillar 210, thus forming the vertical string 130 as a "vertical" string of memory cells. The source cap 220 is in electrical contact with the pillar 210 and forms a p-n junction with the pillar 210. The drain cap 230 is in electrical contact with the pillar 210 and forms a p-n junction with the pillar 210. The source cap 220 is a source for the pillar 210 and the drain cap 230 is a drain for the pillar 210. The source cap 220 is coupled to the common source 145. The drain cap 230 is coupled to the data line 155.

As word lines 160-1 through 160-15 (for example) in 3D devices are vertically stacked, it may become increasing difficult to couple the word lines to planar, e.g., two-dimensional (2D), silicon devices. For example, it may be difficult to couple the word lines to string drivers (not shown) that are used to access memory cells.

In some conventional 3D memory systems, in order to increase available layout space to provide for increased routings and increased connections to, for example, a string driver, multiple sub-blocks are introduced. The sub-blocks of a block may share the same group of word lines, the same source select (SGS) line, and the same data line and common source. The sub-blocks of a block may each have separate drain select (SGD) lines (where the SGD transistors of a particular sub-block are coupled to a respective one of the SGD lines). However, by increasing the number of sub-blocks, block size may be increased. Accordingly, the time to erase blocks may be increased. Furthermore, memory may become fragmented more readily with increased block size.

Many embodiments serve to reduce the number of routings used in the memory device 100. Rather than increasing available layout space by increasing the number of sub-blocks, many embodiments maintain the same number of sub-blocks in the 3D memory device 100. In some embodiments, therefore, the number of sub-blocks may be kept relatively low. Memory devices 100 according to most embodiments may therefore provide reduced block erase times, and reduced memory fragmentation.

Example embodiments may reduce the number of routings by reducing the number of separate SGD lines. Some two-dimensional (2D) memory systems may reduce the number of separate SGD lines to reduce overall chip size. However, in contrast, example embodiments for 3D memory systems may reduce the number of separate SGD lines so that small block sizes may be maintained.

Referring again to FIG. 1, it can be seen that some embodiments provide drain select (SGD) lines 165-0 through 165-n. The drain select line 165-0 may be coupled to the SGD transistor 150-1 in the first sub-block 120-1 of the first block 110-1, to the SGD transistor 152-1 of the first sub-block 120-4 of the second block 110-2, and to the SGD transistor 154-1 of the first sub-block 120-7 of the n-th block 110-n, as well as to the SGD transistors of other first sub-blocks of any blocks (not shown) between the second block 110-2 and the n-th block 110-n. Similarly, a second drain select line 165-1 may be coupled to the SGD transistor 150-2 of the second sub-block 120-2 of the first block 110-1, to the SGD transistor 152-2 of the second sub-block 120-5 of the second block 110-2, and to the SGD transistor 154-2 of the second sub-block 120-8 of the n-th block 110-n, as well as to the SGD transistors of other second sub-blocks of any blocks (not shown) between the second block 110-2 and the n-th block 110-n. In other words, a drain select line may couple SGD transistors of corresponding sub-blocks in each block in a group of blocks of a memory device. Other or subsequent groups of blocks in the memory device 100 may similarly share drain select lines, as described below with respect to FIG. 3.

Figure 3:
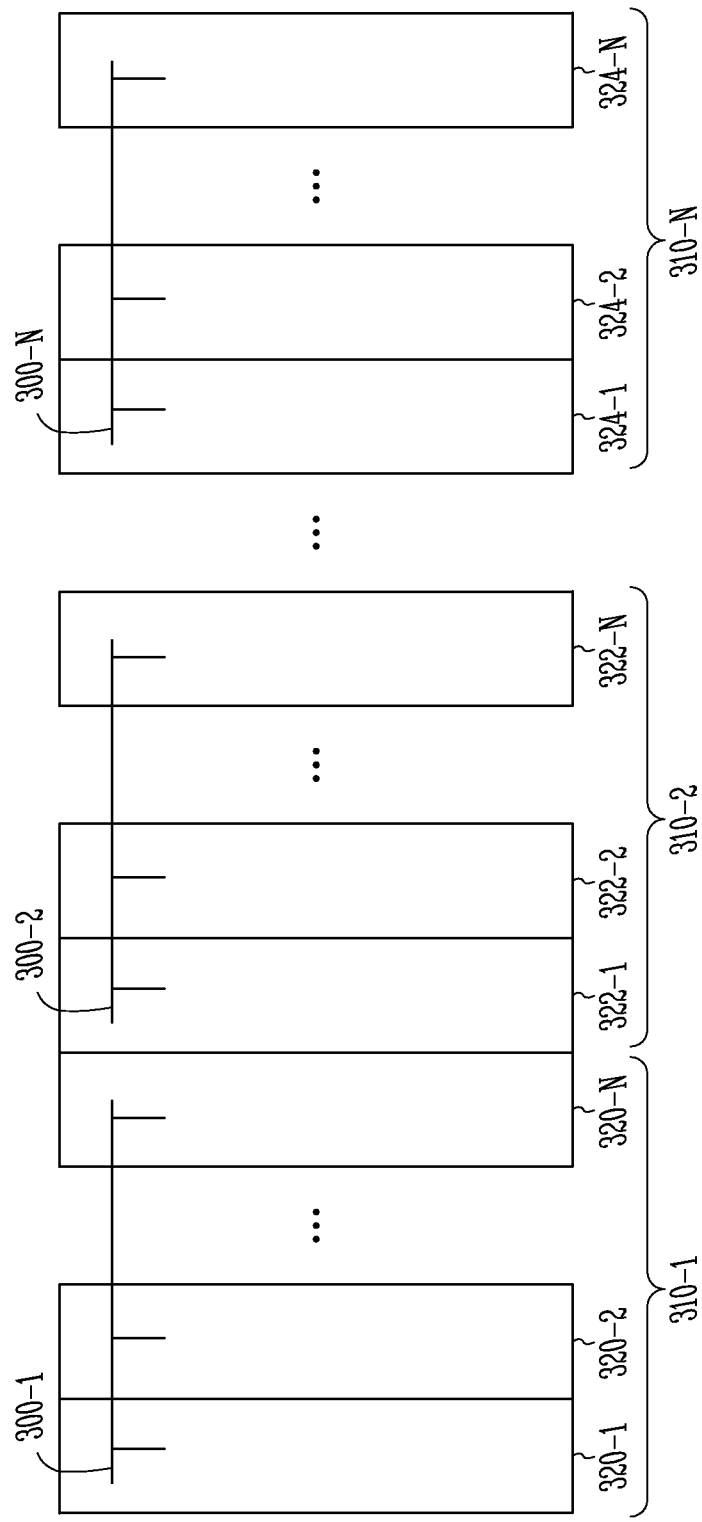
FIG. 3 is a block diagram of drain select gate (SGD) connections according to various embodiments of the invention.

FIG. 3 is a block diagram of groups 310-1 through 310-n of blocks sharing drain select lines as described above and in accordance with example embodiments. Blocks 320-1 through 320-n in group 310-1 share drain select lines 300-1. Blocks 322-1 through 322-n in group 310-2 share drain select lines 300-2. Similarly, blocks 324-1 through 324-n in group 310-n share drain select lines 300-n.

As shown in FIGS. 4A and 4B, in an example embodiment, two transistors may be associated with each SGD line shared by a group of blocks and two transistors may be associated with each block in the group of blocks. For example, in FIG. 4A, a sub-block select transistor blken may be energized to select a corresponding SGD line shared by a group of blocks, to bias the SGD line to a bias voltage of the blken transistor. A sub-block deselect transistor blken_ may be energized to deselect the corresponding SGD line shared by the group of blocks. In the illustrative example, a deselected SGD line may be biased to ground.

Similarly, in FIG. 4B, a block select transistor blken for a first block may be energized to select the SGS line of the first block, thereby biasing the SGS line of the first block to a bias voltage of the blken and the block deselect transistors blken_ for other blocks may be energized to deselect the other blocks. The deselected SGS lines may be biased to an unselect bias, as shown in FIG. 4B. Alternatively, the deselected SGS lines may be biased to ground similarly to the case of the deselected SGD lines shown in FIG. 4A. Further, the deselected SGD lines may be biased to an unselect bias, similar to the case of the deselected SGS lines shown in FIG. 4B.

The overall number of transistors used in example embodiments may be reduced relative to the overall number of transistors used in such conventional systems. For example, in at least one embodiment, drain select lines for selecting SGDs may be shared between four blocks, where the four blocks comprise a group of blocks. Accordingly, one set of sub-block select and deselect transistors (blken and blken_, FIG. 4A) may be used to select and deselect multiple corresponding SGDs of corresponding multiple sub-blocks. In the illustrative example, therefore, the number of sub-block select transistors and/or the number of sub-block deselect transistors is reduced by a factor of four relative to conventional systems. Other example embodiments may group blocks into groups of two, eight, or sixteen blocks, for example. The number of sub-block select transistors and/or the number of sub-block deselect transistors therefore would be reduced by a factor of two, eight, and sixteen, respectively, in these example embodiments.

Figure 5:
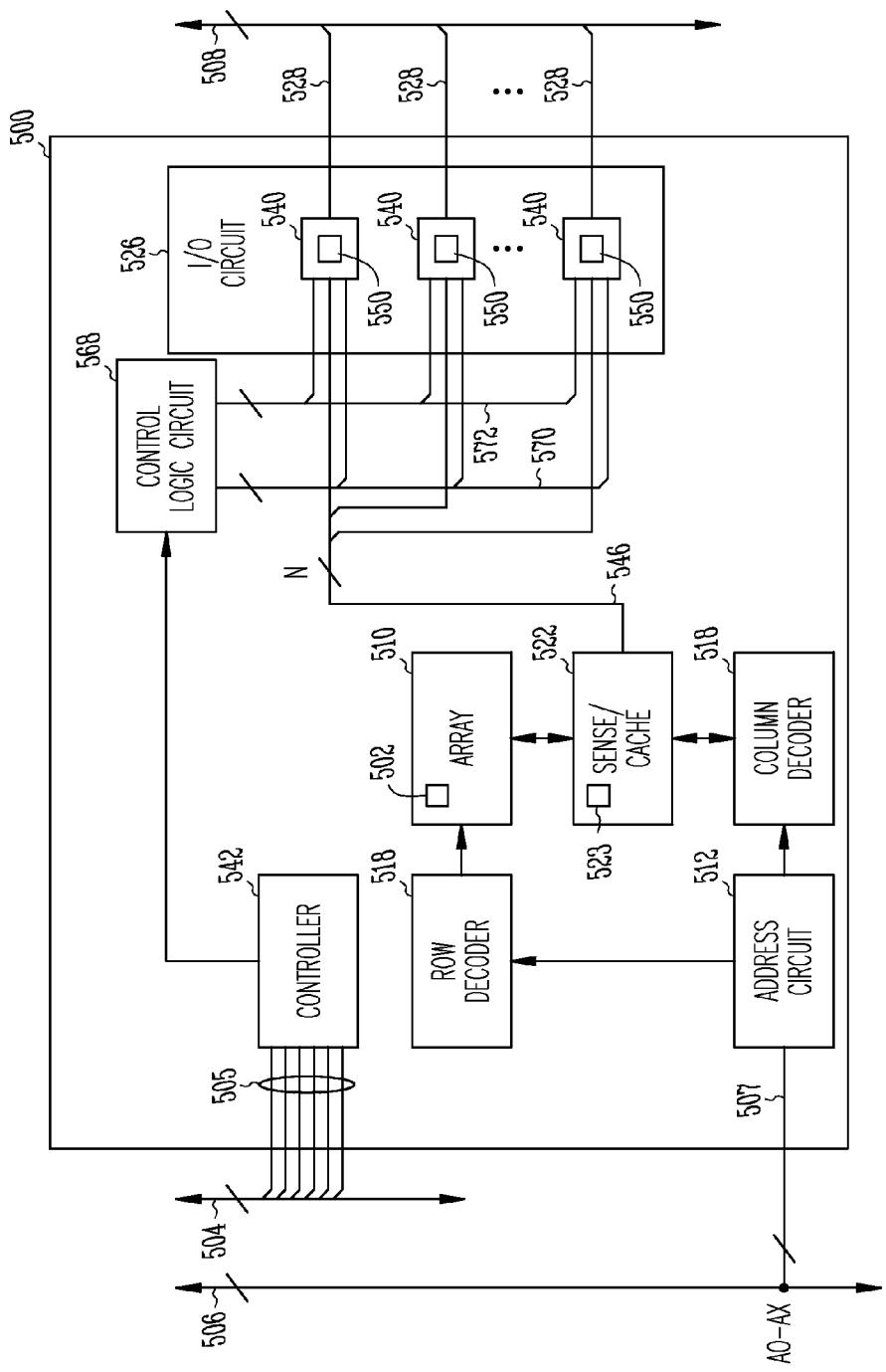
FIG. 5 is a block diagram of a memory system in accordance with some embodiments.

FIG. 5 is a block diagram of an apparatus in the form of a memory device 500 according to various embodiments of the invention. The memory device 500 may be coupled to a control bus 504 to receive multiple control signals over control signal lines 505. The memory device 500 may be further coupled to an address bus 506 to receive address signals A0-Ax on address signal lines 507 and to a data bus 508 to transmit and receive data signals. Although depicted as being received on separate physical busses, the data signals may also be multiplexed and received on the same physical bus. The memory device 500 may be coupled to a processor (not shown) in a system.

The memory device 500 may include one or more arrays 510 of memory cells that may be arranged in rows and in columns. The memory cells of the array 510 may comprise non-volatile memory cells (e.g., charge storage devices, such as floating gate transistors or charge trap transistors) according to various embodiments of the invention. The memory device 500 may be a NAND memory device. The memory device may be a 3D NAND memory device. The array 510 may include multiple banks and blocks of memory cells residing on a single die or on multiple dice as part of the memory device 500. The array 510 may include one or more of the blocks 110-1 through 110-n (FIG. 1) according to various embodiments of the invention. The array 510 may include two or more groups of blocks 110-1 through 110-n.

A data input and output (I/O) circuit 526 may implement bi-directional data communication over external (e.g., data I/O) nodes 528 coupled to the data bus 508. The I/O circuit 526 may include N driver and receiver circuits 540 according to various embodiments. The memory device 500 may include a controller that is configured to support operations of the memory device 500, such as writing data to and/or erasing data from the array 510. The controller may comprise, for example, control circuitry 542 (e.g., configured to implement a state machine) on a same or different die than that which includes the array 510 and/or any or all of the other components of the memory device 500. The controller may comprise the control circuitry 542, firmware, software or combinations of any or all of the foregoing. Data may be transferred between the sense/cache circuit 522 and the I/O circuit 526 over N signal lines 546. Operations using the memory device may be implemented using the controller.

Figure 6:
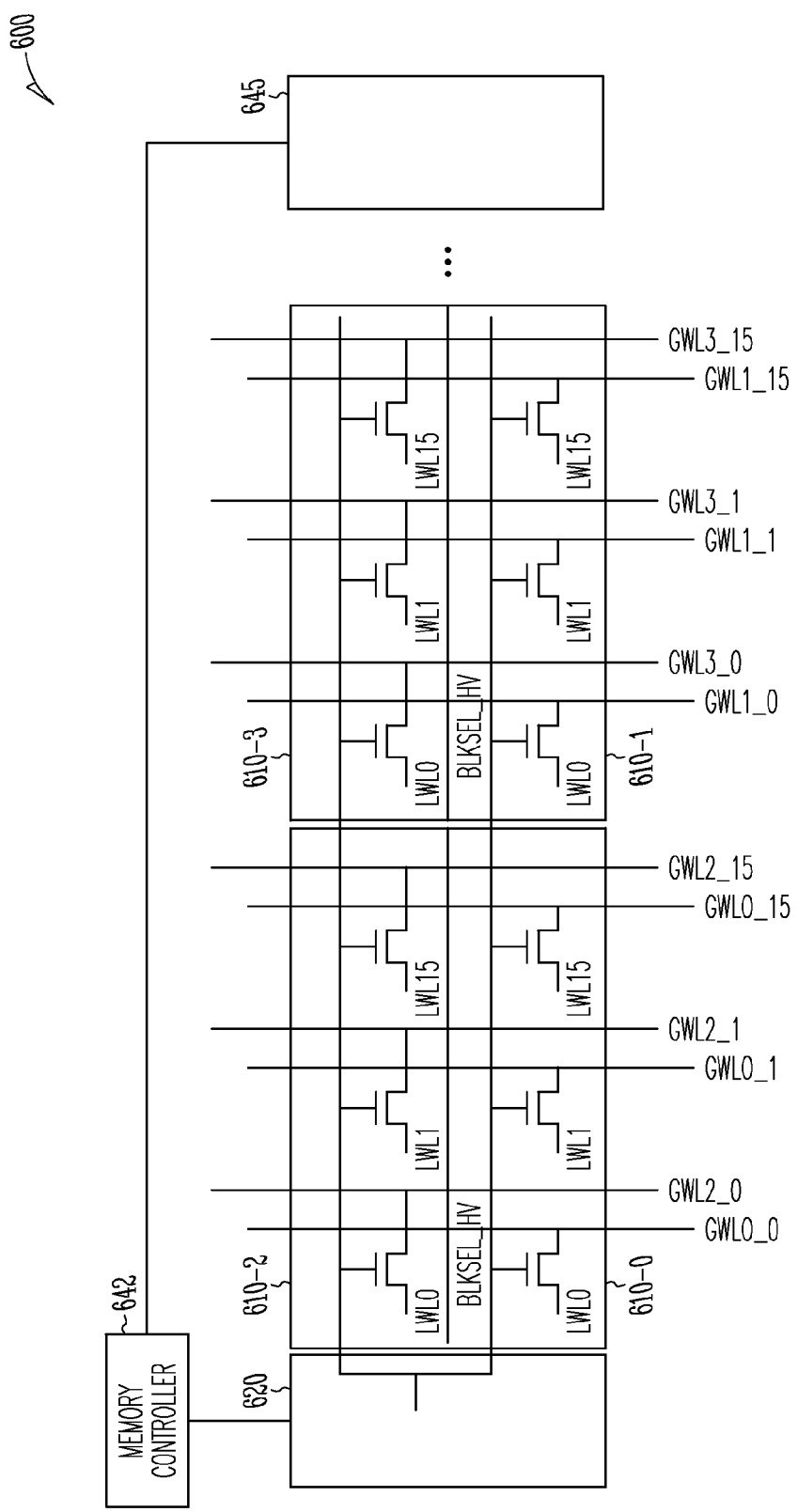
FIG. 6 is a block diagram of an apparatus in the form of a memory device in accordance with some embodiments.

Operations using apparatuses according to example embodiments are illustrated with reference to FIG. 6-8. Referring to FIG. 6, a memory system 600 may include a plurality of blocks of memory cells. In the illustrative example, the memory system 600 includes two blocks of memory cells 610-0 and 610-1. The memory system 600 further includes a block select switch 620, and global word lines GWL0_0, GWL2_0, GWL0_1, GWL2_1, GWL0_15, GWL2_15, GWL1_0, GWL3_0, GWL1_1, GWL3_1, G2L1_15 and GWL3_15 coupled to corresponding memory cells. The global word lines may be coupled to local word lines in each block 610-0 and 610-1. In the illustrative example, each block 610-0 and 610-1 may include 16 local word lines LWL0 through LWL15. The memory system 600 may comprise additional components, for example components illustrated in the memory system 100 (FIG. 1), which are omitted in FIG. 6 in the interest of brevity and clarity.

Figure 7:
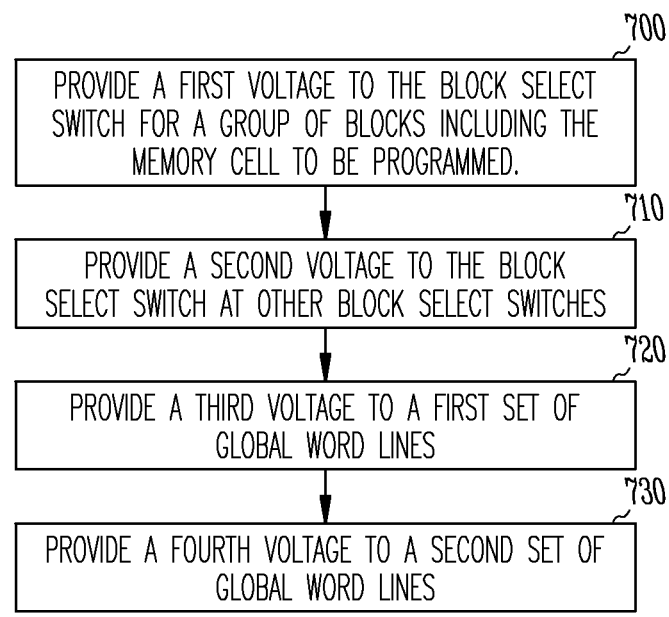
FIG. 7-8 are flow diagrams of methods in accordance with some embodiments.

FIG. 7 illustrates a method for accessing a memory cell in accordance with example embodiments. In operation 700, a first voltage is provided to the block select switch 620 for a group of blocks including the memory cell to be accessed. In operation 710 a second voltage is provided to block select switches for other groups of blocks. The second voltage may be about 0 volts. In operation 720, a third voltage is provided to at least one word line of a first set of global word lines. The first set of global word lines may correspond to the memory cell to be accessed and/or the block that includes the memory cell to be accessed. In operation 730, a fourth voltage is provided to a second set of global word lines. The second set of global word lines may correspond to unselected blocks in a group of blocks.

Source select transistors (FIG. 1) of each of the sub-blocks of a memory block that includes the memory cell to be accessed can be energized via a corresponding source select line (FIG. 1). The drain select transistor (FIG. 1) of a sub-block that includes the memory cell to be accessed can be energized via a corresponding drain select line (FIG. 1).

Further details on implementation of read, write, and erase operations in accordance with various embodiments are provided below.

Figure 8:
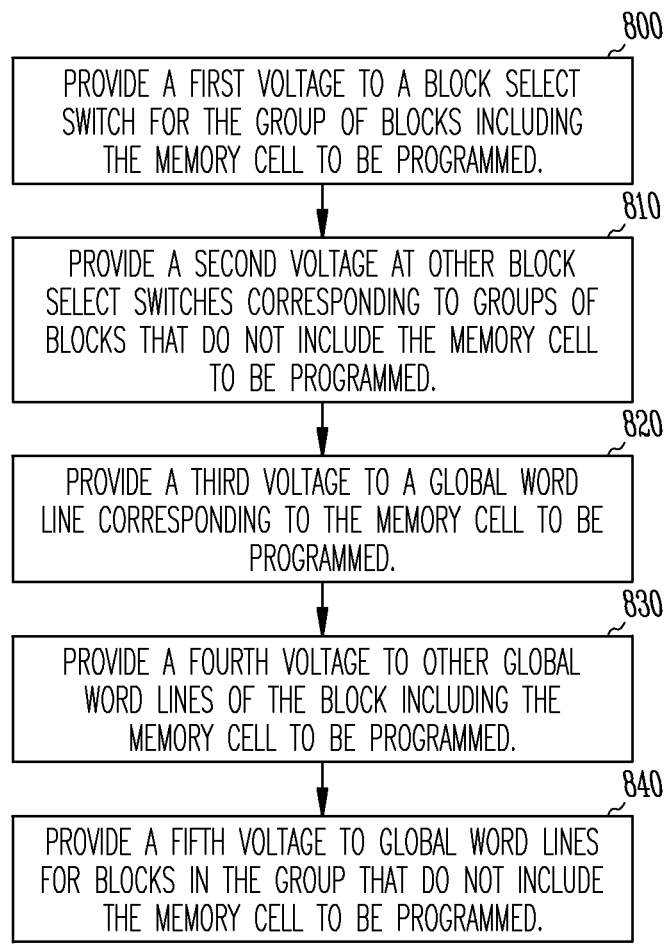

Referring to FIG. 8, in operations to program memory cells, a voltage $V_{pgm\_sw}$ can be provided 800 to a block select switch 620 for the group of blocks including the memory cell to be programmed. In operation 810, a second voltage (e.g., about 0 volts) can be provided to other block select switches 645 corresponding to other groups of blocks that do not include the memory cell to be programmed. In operation 820, a $V_{pgm}$ voltage can be provided to a global word line corresponding to the memory cell to be programmed. In operation 830, a $V_{pass}$ voltage can be provided to other global word lines of the block including the memory cell to be programmed. In operation 840, about 0 volts may be provided to global word lines for blocks in the group that do not include the memory cell to be programmed. The $V_{pgm}$ voltage and the $V_{pass}$ voltage are different in at least one embodiment.

The drain select line (FIG. 1) corresponding to the sub-block including the memory cell to be programmed can be selected by energizing the sub-block select transistor (FIG. 4A) corresponding to that sub-block. The sub-block deselect transistors for drain lines corresponding to sub-blocks that do not include the memory cell to be programmed can be energized. The source select line (FIG. 1) corresponding to the block including the memory cell to be programmed may be selected by energizing the block select transistor for the respective SGS. The source select lines corresponding to other blocks that do not include the memory cell to be programmed may be deselected by energizing the block deselect transistors for the respective source select lines.

In operations to read memory cells, a voltage $V_{pass\_sw}$ may be provided to a block select switch 620 for the group of blocks including the memory cell to be read. About 0 volts may be provided to the other block select switches corresponding to other groups of blocks that do not include the memory cell to be read. The drain select line (FIG. 1) corresponding to the sub-block including the memory cell to be read can be selected by energizing the sub-block select transistor (FIG. 4A) corresponding to that sub-block. The sub-block deselect transistors for drain lines corresponding to sub-blocks that do not include the memory cell to be read can be energized. The source select line (FIG. 1) corresponding to the block including the memory cell to be read may be selected by energizing the block select transistor for the respective SGS. The source select lines corresponding to other blocks that do not include the memory cell to be read may be deselected by energizing the block deselect transistors for the respective source select lines. A $V_{wlrv}$ voltage can be provided to a global word line corresponding to the memory cell to be read, and a $V_{pass}$ voltage can be provided to other global word lines of the block including the memory cell to be read. About 0 volts can be provided to global word lines for blocks in the group that do not include the memory cell to be read. The $V_{wlrv}$ voltage and the $V_{pass}$ voltage are different in at least one embodiment.

In operations to erase memory cells, an erasing voltage (for example, 3-4 volts) can be provided to a block select switch 620 for the group of blocks including the memory cell to be erased. About 0 volts can be provided to the other block select switches 645 corresponding to other groups of blocks that do not include the memory cell to be erased. An erase voltage can be provided to the common source 145 (FIG. 1) for the blocks including the block to be erased. About 0 volts can be provided to global word lines coupled to the block to be erased, while the global word lines coupled to other blocks in the group can be allowed to float.

Example structures and methods of operating blocks of vertical strings of memory cells have been described as specific embodiments, but it will be evident to those of ordinary skill in the art, after reading and understanding the content of this disclosure, that various modifications and changes may be made. Accordingly, the specification and drawings are to be regarded in an illustrative rather than a restrictive sense.

The Abstract of the Disclosure is provided to comply with 37 C.F.R. §1.72(b), requiring an abstract that allows the reader to quickly ascertain the nature of the technical disclosure. It is submitted with the understanding that it will not be used to interpret or limit the claims. In addition, in the foregoing Detailed Description, it may be seen that various features are grouped together in a single embodiment for the purpose of streamlining the disclosure. This method of disclosure is not to be interpreted as limiting the claims. Thus, the following claims are hereby incorporated into the Detailed Description, with each claim standing on its own as a separate embodiment.

What is claimed is:

1. An apparatus comprising:
a plurality of blocks of memory cells, including a first block and a second block, wherein a block includes two or more sub-blocks, including a first sub-block and a second sub-block, a sub-block including a vertical string of memory cells including a respective plurality of memory cells, a respective source select transistor, and a respective drain select transistor;
two or more drain select lines, including a first drain select line and a second drain select line, the first drain select line being coupled to the drain select transistor in the first sub-block of the first block and the first drain select line being coupled to the drain select transistor in the first sub-block of the second block, and the second drain select line being coupled to the drain select transistor in the second sub-block of the first block and the second drain select line being coupled to the drain select transistor in the second sub-block of the second block; and
a plurality of transistors comprising select transistors and deselect transistors wherein a first select transistor and a first deselect transistor are coupled to the first drain select line and a second select transistor and a second deselect transistor are coupled to the second drain select line wherein the first select transistor is configured to couple a select bias to the first drain select line at a first time, the second select transistor is configured to couple the select bias to the second drain select line at a second time, different from the first time, the first deselect transistor is configured to couple a deselect bias to the first drain select line at the second time, and the second deselect transistor is configured to couple the deselect bias to the second drain line at the first time.

2. The apparatus of claim 1, further comprising:
two or more source select lines, including a first source select line and a second source select line, the first source select line being coupled to the source select transistors in the first sub-block and the second sub-block of the first block of memory cells and the second source select line being coupled to the source select transistors in the first sub-block and the second sub-block of the second block of memory cells.

3. The apparatus of claim 1, wherein the memory cells of each vertical string are associated with a respective pillar comprising semiconductor material.

4. The apparatus of claim 1, wherein each block of memory cells is associated with at least four access lines, each of the at least four access lines being located in a different tier of a semiconductor construction.

5. The apparatus of claim 4, wherein, for each block
each vertical string in the first sub-block is coupled to a first access line located in a first tier and to a second access line located in a second tier, and
each vertical string in the second sub-block is coupled to the first access line and to the second access line.

6. The apparatus of claim 1, further comprising a common source coupled to each vertical string of each of the plurality of blocks.

7. An apparatus comprising:
a plurality of blocks of memory cells, including a first block of memory cells and a second block of memory cells;
two or more source select lines;
two or more drain select lines;
a block select switch,
each block of the plurality of blocks including two or more sub-blocks, the two or more sub-blocks including a first sub-block and a second sub-block, each sub-block including
a vertical string of memory cells, each vertical string including a respective plurality of memory cells, a respective source select transistor and a respective drain select transistor,
the two or more drain select lines including a first drain select line and a second drain select line, the first drain select line being coupled to the drain select transistor in the first sub-block of each block of memory cells of the plurality of blocks of memory cells and the second drain select line being coupled to the drain select transistor in the second sub-block of each block of memory cells of the plurality of blocks of memory cells; and
a plurality of transistors comprising select transistors and deselect transistors wherein a first select transistor and a first deselect transistor are coupled to the first drain select line and a second select transistor and a second deselect transistor are coupled to the second drain select line wherein the first select transistor is configured to couple a select bias to the first drain select line at a first time, the second select transistor is configured to couple the select bias to the second drain select line at a second time, different from the first time, the first deselect transistor is configured to couple a deselect bias to the first drain select line at the second time, and the second deselect transistor is configured to couple the deselect bias to the second drain line at the first time.

8. The apparatus of claim 7, further comprising:
a first set of access lines coupled to corresponding memory cells in each vertical string of memory cells in the first block; and
a second set of access lines coupled to corresponding memory cells in each vertical string of memory cells in the second block.

9. The apparatus of claim 8, wherein each of the access lines of the first set of access lines is located in a different tier of a semiconductor construction and each of the access lines of the second set of access lines is located in a different tier of the semiconductor construction.

10. The apparatus of claim 8, wherein the memory cells of each vertical string are associated with a respective pillar comprising semiconductor material.

11. The apparatus of claim 7, wherein
the plurality of blocks of memory cells comprises a first group of blocks;
the block select switch is coupled to the first group of blocks; and the apparatus further comprises a second block select switch coupled to a second group of blocks.

12. The apparatus of claim 7, further comprising:
two or more source select lines, including a first source select line and a second source select line, the first source select line being coupled to the source select transistors in the first block of memory cells and the second source select line being coupled to the source select transistors in the second block of memory cells.

13. The apparatus of claim 7, further comprising a common source coupled to each vertical string of each of the plurality of blocks.

14. An apparatus comprising:
a plurality of tiers of access lines associated with two or more vertical strings of memory cells of a first memory block, a sub-block of the first memory block including a vertical string of memory cells comprising a source select transistor and a drain select transistor;
a drain select line, coupled to the drain select transistor of the sub-block of the first memory block, the drain select line being further coupled to a drain select transistor associated with a sub-block of a second memory block, the first memory block and the second memory block comprising a group of memory blocks; and
a plurality of transistors comprising a sub-block select transistor and a sub-block deselect transistor coupled to the drain select line wherein the sub-block select transistor is configured to couple a select bias to the drain select line at a first time and the sub-block deselect transistor is configured to couple a deselect bias to the drain select line at a second time, different from the first time.

15. The apparatus of claim 14, wherein the sub-block select and deselect transistors are shared by the first and second blocks.

16. The apparatus of claim 14, wherein the group of memory blocks comprises a first group of memory blocks and the drain select line comprises a first drain select line, the apparatus further comprising:
a second group of memory blocks including a third memory block and a fourth memory block, a sub-block of the third memory block including a vertical string of memory cells comprising a source select transistor and a drain select transistor; and
a second drain select line different from the first drain select line, the second drain select line coupled to the drain select transistor of the sub-block of the third memory block and further coupled to a drain select transistor associated with a sub-block of the fourth memory block.

17. The apparatus of claim 14, wherein the apparatus comprises a memory device.

18. The apparatus of claim 17, wherein the apparatus comprises a NOT AND (NAND) memory device.

19. The apparatus of claim 14, wherein each of the plurality of tiers of access lines associated with one vertical string of memory cells is located in a different tier of a semiconductor construction.

20. The apparatus of claim 14, further comprising:
two or more source select lines, including a first source select line and a second source select line, the first source select line being coupled to the source select transistor of the sub-block of the first block of memory cells and the second source select line being coupled to a source select transistor of the sub-block of the second block of memory cells.

21. The apparatus of claim 14, wherein the memory cells of each vertical string are associated with a respective pillar comprising semiconductor material.

22. A method of accessing a memory cell of a first block of memory cells in an apparatus comprising a plurality of blocks of memory cells including the first block and a second block of memory cells, the first block and the second block included in a first group of blocks, the first group of blocks having an associated first block select switch, the apparatus further comprising a first set of global access lines coupled to the first block and a second set of global access lines coupled to the second block, the apparatus further comprising a second group of blocks, the second group of blocks having an associated second block select switch, the method comprising:
providing a first voltage to the first block select switch;
providing a second voltage to the second block select switch;
providing a third voltage to at least one of the first set of global access lines that are coupled to first local access lines;
providing a fourth voltage to the second set of global access lines that are coupled to second local access lines;
energizing, via a source select line, source select transistors of the first block of memory cells; and
energizing, via a drain select line, a drain select transistor of a first sub-block of the first block to which the memory cell belongs, the drain select line further arranged to energize a drain select transistor of a corresponding first sub-block in the second block of memory cells; and
energizing a deselect transistor of a second sub-block of the first block and a corresponding second sub-block of the second block substantially simultaneously with energizing the drain select transistor of the first sub-block.

23. The method of claim 22, wherein providing the third voltage to at least one of the first set of global access lines comprises providing a program voltage to one of the first set of global access lines.

24. The method of claim 23, further comprising providing a pass voltage, as the fourth voltage, to the other global access lines, of the first set of global access lines.

25. The method of claim 24, further comprising providing a fifth voltage to the second set of global access lines that comprises providing about 0 volts to the second set of global access lines.

* * * * *